United States Patent
Yamagata et al.

[11] Patent Number: 5,930,194
[45] Date of Patent: Jul. 27, 1999

[54] SEMICONDUCTOR MEMORY DEVICE CAPABLE OF BLOCK WRITING IN LARGE BUS WIDTH

[75] Inventors: Tadato Yamagata; Akira Yamazaki; Shigeki Tomishima; Makoto Hatakenaka; Masashi Matsumura, all of Hyogo, Japan

[73] Assignees: Mitsubishi Denki Kabushiki Kaisha; Mitsubishi Electric Engineering Company Limited, both of Tokyo, Japan

[21] Appl. No.: 09/109,089

[22] Filed: Jul. 2, 1998

[30] Foreign Application Priority Data

Jan. 5, 1998 [JP] Japan .................................. 10-000226

[51] Int. Cl.⁶ ...................................... G11C 8/00
[52] U.S. Cl. ................. 365/230.03; 365/189.01; 365/230.01
[58] Field of Search .............. 365/230.03, 200, 365/225.7, 189.07, 189.01, 189.04, 230.01

[56] References Cited

U.S. PATENT DOCUMENTS

| | | | |
|---|---|---|---|
| 5,293,348 | 3/1994 | Abe | 365/230.03 |
| 5,416,740 | 5/1995 | Fujita et al. | 365/230.03 |
| 5,422,850 | 6/1995 | Sukegawa et al. | 365/230.06 |
| 5,546,350 | 8/1996 | Gillingham | 365/230.06 |

FOREIGN PATENT DOCUMENTS 4-311897  11/1992  Japan .
8-55473   2/1996   Japan .

OTHER PUBLICATIONS

"A Multimedia 32b RISC Microprocessor with 16Mb DRAM", Shimizu et al., 1996 IEEE International Solid-State Circuits Conference, 1996 Digest of Technical Papers, ISSCC96/Session 13/Microprocessors/Paper 13.4, pp. 216–217.

Primary Examiner—David Nelms
Assistant Examiner—David Lam
Attorney, Agent, or Firm—McDermott, Will & Emery

[57] ABSTRACT

Columns included in a sub-block are divided into first and second groups. If a defective memory cell column is present in the first group, an address comparison circuit activates a signal to select a redundant memory cell column, then selection prohibiting signal attains an "L" level based on information programmed in a programming circuit, a selection of a column in the first group is prohibited, and a redundant memory cell column selection signal is activated. Meanwhile, a normal selecting operation is performed to the second column group.

12 Claims, 15 Drawing Sheets

SEMICONDUCTOR MEMORY DEVICE CAPABLE OF BLOCK WRITING IN LARGE BUS WIDTH

BACKGROUND OF THE INVENTION

1. Field of the Invention

The present invention relates generally to semiconductor memory devices, and more particularly, to a data writing circuit in a semiconductor memory device. More particularly, the present invention relates to a semiconductor memory device having an operation mode to simultaneously write the same data to more memory cells than a normal writing operation.

2. Description of the Background Art

In recent years, more semiconductor memories have been utilized in the field of graphics. The semiconductor memory utilized in the field is required of a so-called "block writing" function. For example, some SGRAM (Synchronous Graphic Random Access Memories) have such "block writing" operation mode as a function advantageous for high speed operation such as clearing the picture plane.

Meanwhile, a DRAM core in an embedded DRAM/logic circuit chip including both a DRAM (Dynamic Random Access Memory) and a logic circuit for processing graphic data is required of the "block writing" function.

The block writing function corresponds to the function of simultaneously writing the same data to more memory cells than a normal writing operation in terms of operations of the DRAM.

FIG. 16 is a schematic block diagram of the configuration of a semiconductor memory device 5000 having a conventional block writing function.

Semiconductor memory device 5000 includes four memory cell array mats #M0 to #M3. Each memory cell array mat includes memory cells arranged in a matrix of rows and columns. A row decoder 5110 and a column decoder 5200 are provided corresponding to each of the memory cell array mats. Row decoder 5110 responds to an externally applied address signal to select a corresponding row (word line), and column decoder 5200 responds to an externally applied address signal to select a corresponding column.

A bit line pair BL, /BL (not shown) is provided corresponding to each of the memory cell columns, and in a writing column decoder 5200 provides writing data to bit line pair BL, /BL corresponding to a selected column.

FIG. 17 is a schematic block diagram for illustrating further in detail the configuration of column decoder 5200 shown in FIG. 16.

A column address buffer 5202 generates internal column address signals CA0, /CA0 to CAm, and /CAm based on an externally applied column address signal. A column predecoder 5204 receives internal column address signals CA0, /CA0 to CAm, and /CAm and outputs a predecoded signal. Column decoder 5200 includes column selecting signal generation circuits 5206a to 5206d for selecting a corresponding memory cell based on the predecoded internal column address signal received from column predecoder 5204.

FIG. 17 shows the configuration of column selecting signal generation circuits 5206a to 5206d (which corresponds to the region within the ellipse shown in FIG. 16) for memory cell array mat #M3 shown in FIG. 16.

Referring to FIGS. 16 and 17, memory cell array mat #M3 is divided into four sub-blocks, sub-blocks 0 to sub-block 3, similarly to other memory cell array mats #M0 to #M2. Each sub-block equally includes one fourth the columns included in memory cell array mat #M3.

Column selecting signal generation circuits 5206a to 5206d are provided corresponding to sub-blocks 0 to 3, respectively.

Sub-blocks 0 to 3 each include one redundant column.

Column selecting signal generation circuit 5206a includes an address comparison circuit 5230 which receives a predecoded internal column address signal and activates a spare active signal SPA for activating the redundant memory cell column if a prestored defective address matches the predecoded internal column address signal, an inverter 5228 which receives spare active signal SPA and outputs the inverse thereof, and an AND circuit 5210 which receives the predecoded internal column address signal, the output of inverter 5228, an externally applied address signal, and a sub-block activation signal SBA0 attaining an active state ("H" level) when sub-block 0 is selected, and outputs a column selecting signal CSL1 based on the logical product thereof.

In response to column selecting signal CSL1, a memory cell column in corresponding sub-block 0 is selected.

A column selecting signal CSL2 to select the second memory cell column in sub-block 0 is output from an AND circuit 5220 for operating the logical product of signal SBA0, the predecoded internal column address signal, and the output of inverter 5228.

An AND circuit identical to AND circuit 5210 is provided corresponding to a column selecting signal CSLi (i=1 to n, n: natural number) corresponding to each memory cell column included in sub-block 0. For example, a column selecting signal CSLn corresponding to the n-th memory cell column included in sub-block 0 is output from an AND circuit 5224 which receives the predecoded internal column address signal and the output of inverter 5228.

Column selecting signal generation circuit 4206a further includes an AND circuit 5226 which receives spare active signal SPA and sub-block activation signal SBA0 and outputs a signal SCSL to select a redundant memory cell column.

More specifically, if a predecoded internal column address signal matches a defective address stored in a non-volatile manner in address comparison circuit 5230, spare active signal SPA attains an active state ("H" level). A signal output from inverter 5228 attains an "L" level accordingly, and therefore column selecting signals CSL1 to CSLn output from AND circuits 5210 to 5224 are all brought into an inactive state ("L" level).

Meanwhile, if signal SPA is in an active state and sub-block activation signal SBA0 attains an active state ("H" level), signal SCSL to select a redundant memory cell column attains an active state ("H" level).

If the predecoded internal column address signal does not match the defective address stored in address comparison circuit 5230, spare active signal SPA is in an inactive state ("L" level). Thus, a signal output from inverter 5228 attains an "H" level. Depending upon the value of the predecoded internal column address signal, column selecting signal CSLi (i=1 to n) output from one of AND circuits 5210 to 5224 each provided corresponding to a memory cell column is activated, and a corresponding memory cell column is selected as a result.

As described above, if a memory cell column including a defective memory cell is included in sub-block 0, by allowing address comparison circuit 5230 to previously store the defective address, the memory cell column corresponding to the defective address is replaced with the redundant memory cell column.

Column selecting signal generation circuits 5206b to 5206d provided corresponding to sub-blocks 1 to 3, respectively also include the same configuration.

Herein, sub-blocks 1 to 3 are selected as sub-block activation signals SBA1 to SBA3 attain an active state, respectively, in response to an externally applied address signal, so that a memory cell column in a sub-block is selected.

In semiconductor memory device 5000 as shown in FIGS. 16 and 17, one column selecting signal CSLi is activated in a selected sub-block during a normal reading/writing, and only one column is selected. None of column selecting signals is activated for the non-selected sub-blocks.

If, for example, among the four sub-blocks, two sub-blocks are activated, and the other two sub-blocks are in an inactive state, two memory cell columns are simultaneously selected in one memory cell array mat.

Meanwhile, in the above-described block writing mode, the four sub-blocks are all activated, in other words all the sub-block activation signals SBL0 to SBL3 attain an "H" level, and the four memory cell columns are simultaneously selected in one memory cell array mat.

By such operations, during the block writing operation, data may be simultaneously written to memory cells as twice as the number of memory cells written in a normal writing.

In the above-described SGRAM, if the bus width (the number of data bits exchanged at a time) of a data bus exchanging data with the outside may be increased, the device may be more advantageously used for high speed data transfer.

Furthermore, in a chip including both DRAMs and logic circuits, which has attracted much attention in recent years, by securing a large internal data bus width between a DRAM and a logic, the data transfer rate between the DRAM and the logic can be increased.

If the block writing operation mode is implemented by the method as described in conjunction with FIG. 17, however, it is difficult to increase the bus width for exchanging data with the outside (the internal bus width in the chip including both DRAMs and logic circuits) in the DRAM.

More specifically, the "large bus width" allows much data to be simultaneously read out/written from/to one memory cell array mat. To this end, column selecting signals as many as possible must be activated at a time in one memory cell array mat.

In the configuration shown in FIG. 17, however, the number of column selecting signals which can be activated at a time in one memory cell array mat (the number of memory cell columns which can be selected at a time) is defined by the number of sub-blocks formed by dividing the memory cell array mat.

As in the foregoing, one sub-block is a unit for replacement of a redundant memory cell column. If the number of sub-blocks is arbitrarily increased, the ratio of redundant memory cell columns to normal memory cell columns included in one memory cell array mat increases. As a result, there exists a limitation in increasing the number of sub-blocks while restraining the memory cell array area from being increased.

SUMMARY OF THE INVENTION

It is an object of the present invention to provide a semiconductor memory device capable of block-writing operation and permitting increase in the bus width (internal bus width).

Another object of the invention is to provide a semiconductor memory device capable of high speed block writing operation, while restraining increase in the chip area.

Briefly stated, a semiconductor memory device having a block writing mode according to the present invention includes at least one memory cell array mat, a column selecting circuit and a writing circuit.

Each of the memory cell array mats includes a plurality of memory cells arranged in a matrix of rows and columns.

Each of the memory cell array mats includes a plurality of sub-blocks having a plurality of memory cell columns, and a redundant memory cell column replaceable with a memory cell column including a defective memory cell among the memory cells in a sub-block. The sub-block is each divided into a plurality of column groups.

The column selecting circuit responds to an externally applied address signal to select a corresponding memory cell column in a memory cell array mat.

The column selecting circuit includes a column selecting signal generation circuit which generates a column selecting signal to select one corresponding memory cell column for each of the column groups in the block writing mode specified in response to an externally applied operation mode specifying signal, and a column replacing circuit which selects a corresponding redundant memory cell column if the column selecting signal matches a defective address corresponding to a defective memory cell, and inactivates the column selecting signal to a column group corresponding to the defective address.

The writing circuit selects a corresponding memory cell row in response to an address signal during the period in which the block writing mode is specified, and simultaneously writes externally applied writing data to a plurality of memory cells corresponding to the selected memory cell row and the selected corresponding memory cell column.

Therefore, a main advantage of the present invention is that the column replacing circuit selects a corresponding redundant memory cell column if the column selecting signal matches a defective bit address corresponding to an inactive memory cell, and inactivates a column selecting signal to a column group corresponding to the defective address, and therefore a plurality of memory cell columns per sub-block may be simultaneously selected and written with data in the block writing mode if a memory cell column is replaced with a redundant memory cell column in a sub-block.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a schematic block diagram of the configuration of column decoder circuit 200a;

DESCRIPTION OF THE PREFERRED EMBODIMENTS

First Embodiment

Figure 1:
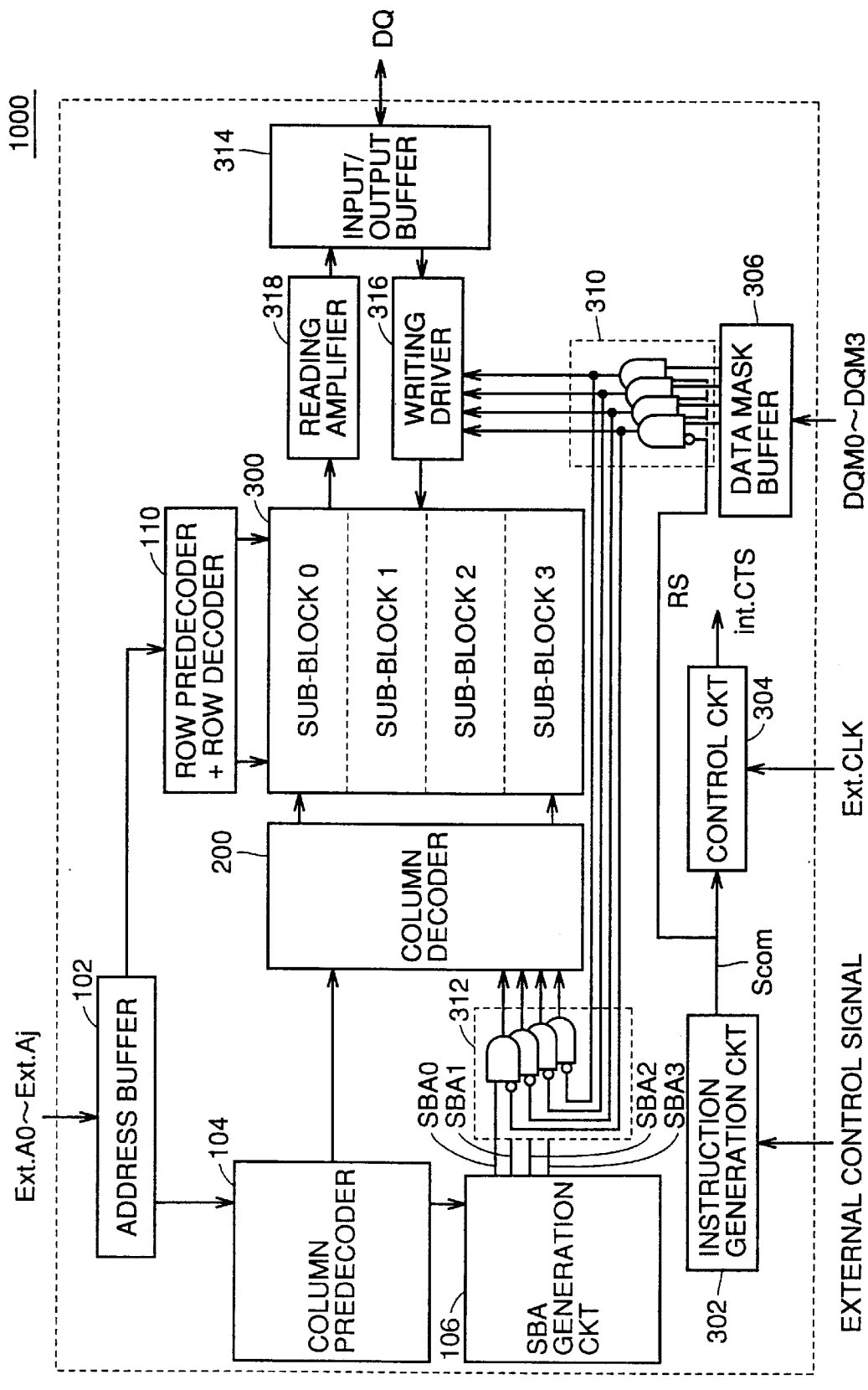
FIG. 1 is a schematic block diagram of the configuration of a DRAM cell according to a first embodiment of the invention.

FIG. 1 is a schematic block diagram of the configuration of a Dynamic Random Access Memory (hereinafter referred to as "DRAM") according to a first embodiment of the invention.

As can be clearly seen from the following description, DRAMs 1000 may be integrated on one chip by themselves or may be provided together with logic circuits on one chip to form a circuit.

DRAM 1000 includes an address buffer 102 which receives externally applied address signals Ext.A0 to Ext.Aj and generates an internal address signal, and a memory cell array mat 300 having a plurality of memory cells arranged in a matrix of rows and columns and divided into sub-blocks 0 to 3, a row predecoder which predecodes an internal row address signal received from address buffer 102, a row decoder which responds to a predecoded row address signal from the row predecoder to select a corresponding row in memory cell array mat 300 (hereinafter, the row predecoder and the row decoder are represented together as "row predecoder+row decoder 110"), a column predecoder 104 which predecodes an internal column address signal received from address buffer 102, a column decoder which receives the output of column predecoder 104 and selects a corresponding column or a redundant column provided for each of the sub-blocks in memory cell array mat 300, an SBA generation circuit 106 which receives an output from column predecoder 104 and generates sub-block selecting signals SBA0 to SBA3, an instruction generation circuit 302 which receives an externally applied control signal and outputs a command signal Scom to specify an operation mode, and a control circuit 304 which receives signal Scom and externally applied clock signal Ext.CLK and outputs an internal control signal int.CTS for controlling the circuit operations of DRAM 1000.

Signal Scom output from instruction generation circuit 302 includes a signal RS activated in a reading mode, and a block writing activation signal BWE activated in a block writing.

DRAM 1000 further includes a data mask buffer 306 which receives externally applied data mask signals DQM0 to DQM3, a data mask signal control circuit 310 which receives data mask signals DQM0 to DQM3 output from data mask buffer 306 and outputs signals DM0 to DM3 under the control of reading mode specifying signal RS output from instruction generation circuit 302, a sub-block signal control circuit 312 which outputs sub-block activation signals SBA0 to SBA3 to column decoder 200 under the control of signals DM0 to DM3 output from data mask signal control circuit 310, an input/output buffer 314 which receives externally applied data DQ and applies the writing data inside or receives data read out from the inside and externally outputs the data as signal DQ, a writing driver circuit 316 which receives writing data provided at input/output buffer 314 and provides the writing data to memory cell array mat 300 under the control of data mask signal control circuit 312, and a reading amplifier 318 which receives and amplifies data read out from a selected memory cell in memory cell array mat 300 and applies the amplified data to input/output buffer circuit 314.

As will be clearly seen, signals DM0 to DM3 output from data mask signal control circuit 310 are all in an inactive level ("L" level) during the period in which a reading mode is specified (signal RS is in an active state "H" level) in response to an externally applied control signal, and sub-block signal control circuit 312 directly outputs signals SBA0 to SBA3 output from SBA generation circuit 106 to column decoder 200 accordingly.

Meanwhile, during the period in which a block writing mode is specified and signal RS is in an inactive level ("L" level), data mask signal control circuit 310 outputs signals DM0 to DM3 at levels corresponding to externally applied signals DQM0 to DQM3 to writing driver 316 and sub-block signal control circuit 312.

In response, in writing driver 316, a data writing is prohibited to a sub-block specified with a data mask operation, while in column decoder 200, a column selecting is prohibited to the sub-block specified with the data mask operation under the control of sub-block signal control circuit 312.

Figure 16:
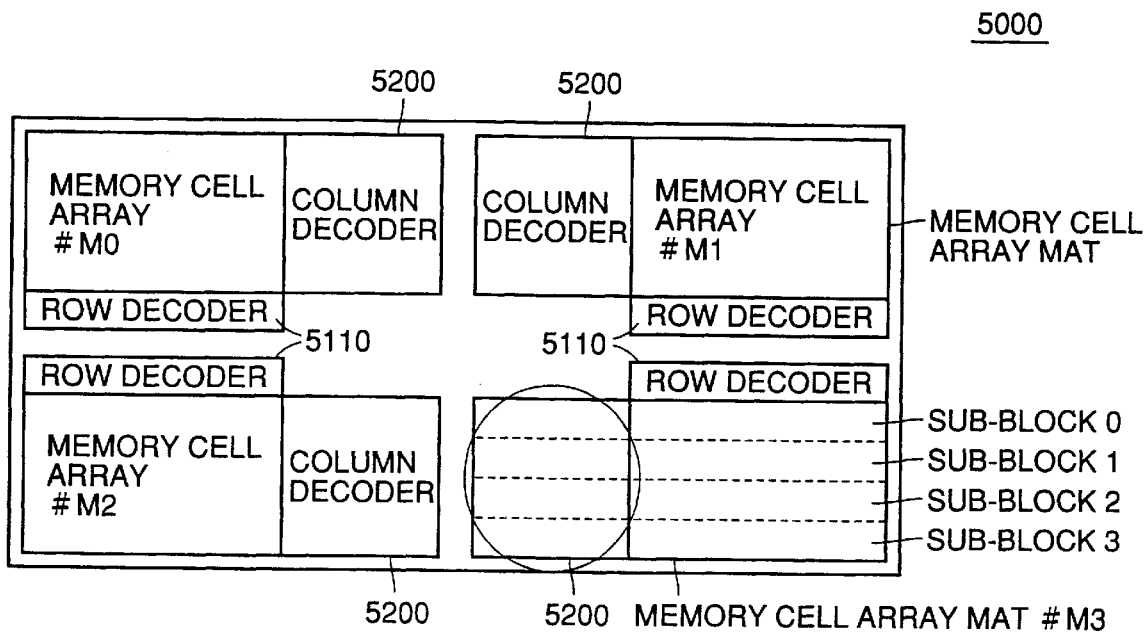
FIG. 16 is a schematic block diagram of the configuration of a conventional DRAM 5000.
Figure 17:
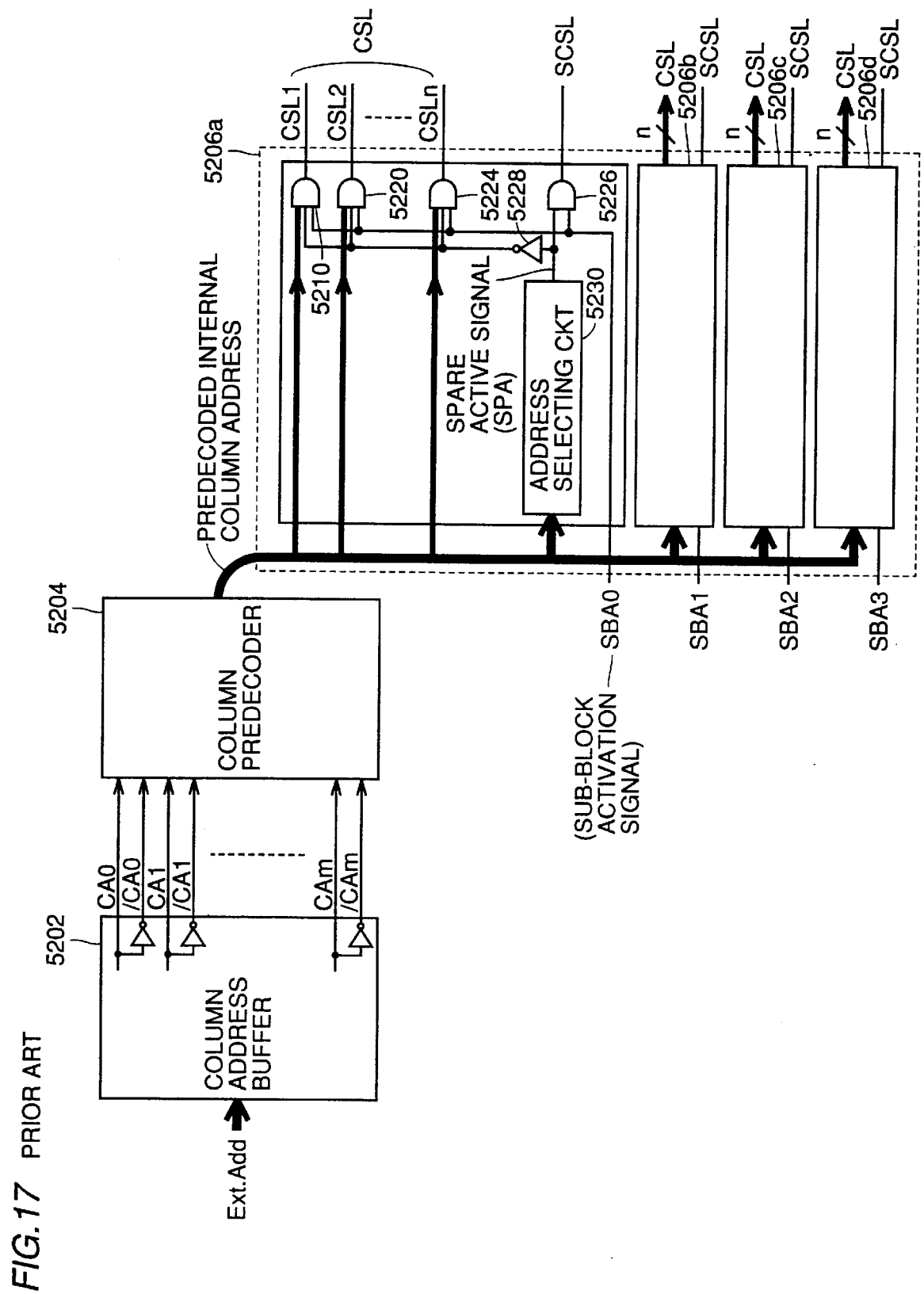
FIG. 17 is a schematic block diagram of the configuration of a column selection related circuit in conventional DRAM 5000.

Note that FIG. 1 shows one memory cell array mat, but the present invention is not limited to this, and is also applicable, for example, to the 4-memory cell array mat arrangement as shown in FIG. 16, or more generally, is applicable to a DRAM including a plurality of memory cell array mats.

In the example shown in FIG. 1, a signal output from SBA generation circuit 106 is provided to column decoder 200 via sub-block signal control circuit 312, but the signal output from SBA generation circuit 106 may be directly applied to column decoder 200. In the following, a signal output from SBA generation circuit 106 is directly applied to column decoder 200.

Figure 2:
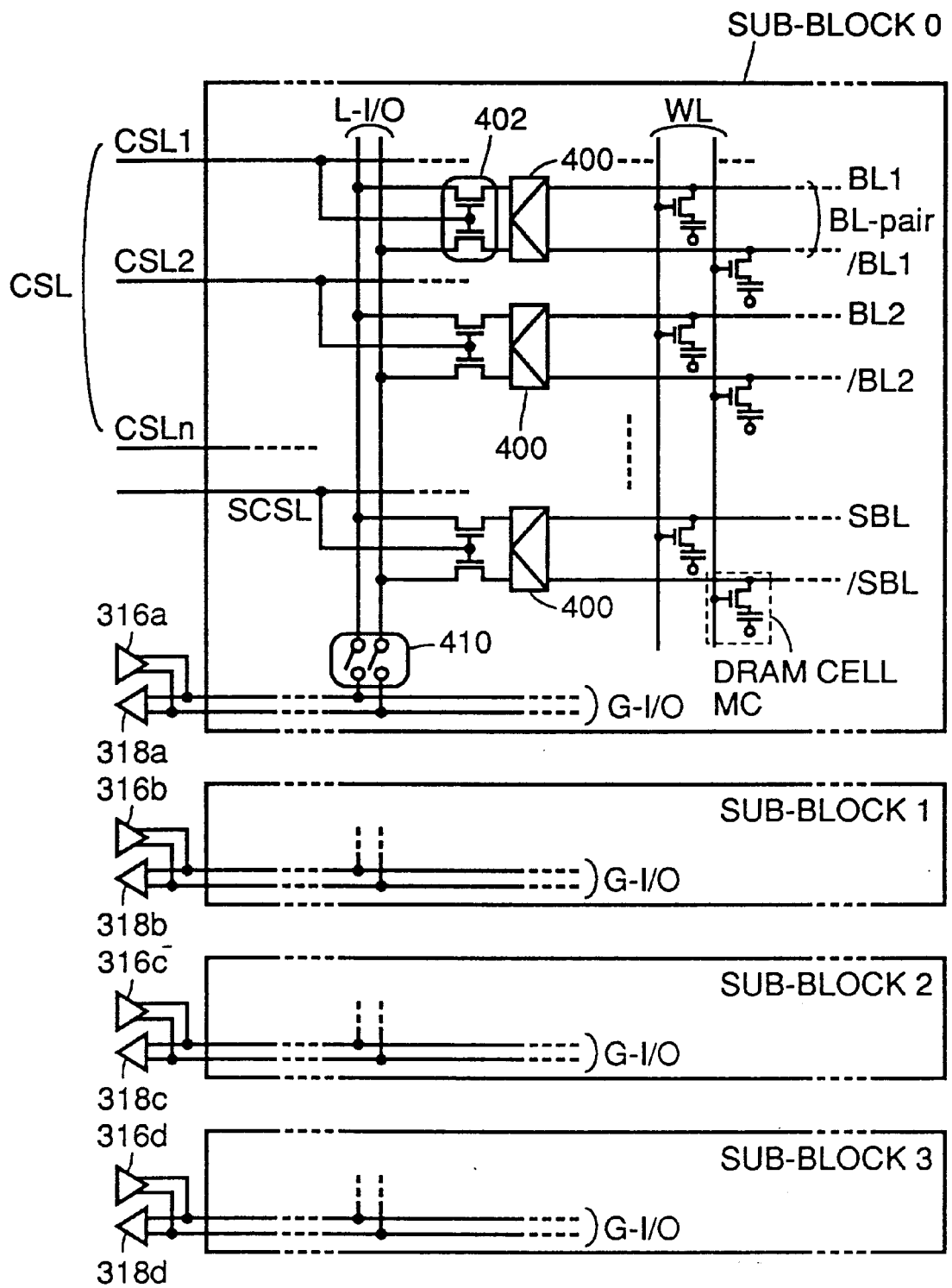
FIG. 2 is a schematic block diagram showing more in detail the configuration of memory cell array mat 300.

FIG. 2 is a circuit diagram showing more in detail the configuration of memory cell array mat 300 shown in FIG. 1.

The memory cell array mat is divided into sub-blocks 0 to 3.

Sub-block 0 includes DRAM cells MC arranged in a matrix of rows and columns, and bit line pairs provided corresponding to the memory cell columns.

In FIG. 2, only bit line pairs BL1, /BL1 and BL2, /BL2 corresponding to two memory cell columns in sub-block 0 are shown by way of illustration.

Sub-block 0 further includes a sense amplifier 400 provided corresponding to a bit line pair SBL, /SBL provided corresponding to a redundant memory cell column and corresponding to a bit line pair in each memory cell column for amplifying data read out from a selected memory cell, and a switch circuit 402 which opens/closes the connection between a bit line pair and a corresponding local IO line pair L-I/O under the control of a corresponding column selecting signal CSLi (i=1 to n, n: even number).

Bit line pair BL1, /BL1 is for example selectively connected to local IO line pair L-I/O by switch circuit 402 controlled by column selecting signal CSL1.

The other bit line pairs and the bit line pairs in redundant memory cell columns have the same configuration.

More specifically, bit line pair BLi, /BLi (i=1, ..., n) is connected to local IO line pair L-I/O by switch circuit 402 controlled by column selecting signal CSLi. Similarly, redundant bit line pair SBL, /SBL is connected to local IO line pair L-I/O by switch circuit 402 controlled by signal SCSL.

Local IO line pair L-I/O is selectively connected to a global IO line pair G-I/O by switch circuit 410 controlled based on an externally applied signal.

Switch circuits 402 and 410 may be for example both formed of a pair of N channel MOS transistors which receive a control signal at their gates.

Global I/O line pair G-I/O is connected to writing driver circuit 316 which drives the potential level of global I/O line pair G-I/O based on externally applied data.

Global I/O line pair G-I/O is also connected to a reading amplifier circuit 318*a* which receives the potential level of global I/O line pair G-I/O driven by the data amplified by the sense amplifier based on data read out from a selected memory cell and applies the potential level to input/output buffer 314.

Writing driver circuit 316*a* is included in writing driver circuit 316 shown in FIG. 1, and reading amplifier 318*a* is included in reading amplifier circuit 318 shown in FIG. 1.

Sub-blocks 1 to 3 have the same configuration.

Column decoder during block writing

Figure 3:
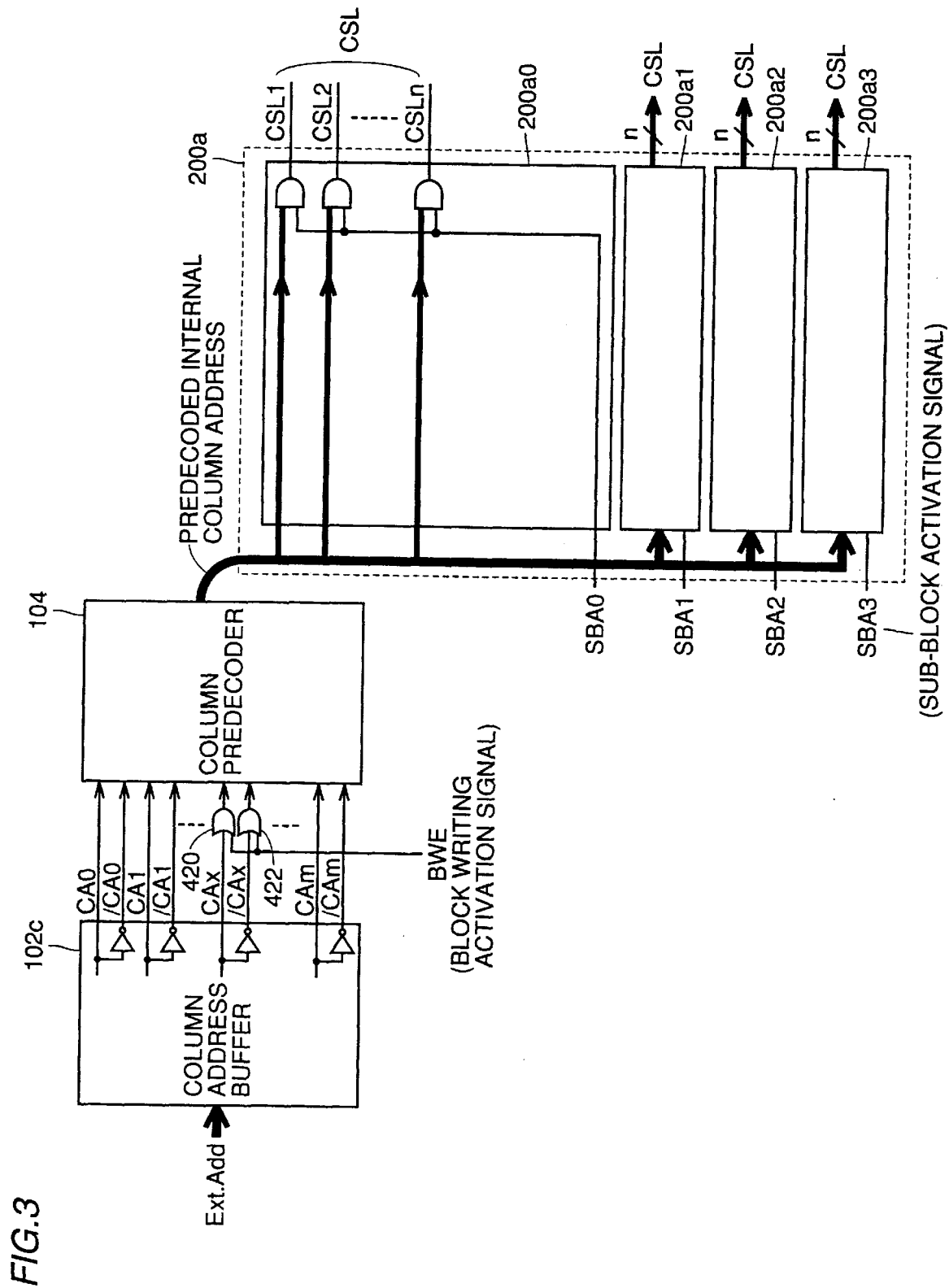

FIG. 3 is a circuit diagram of the configuration of a part of DRAM 1000 shown in FIG. 1 for a column selecting operation.

Column address buffer 102*c* included in address buffer 102 receives externally applied address signals Ext.Add (Ext.A0–Ext.Aj), and outputs internal address signals CA0, /CA0 to CAm, and /CAm. Herein, internal column address signals CAx and /CAx (x=0 to n) are signals at complementary levels to each other.

Among the internal column address signals applied from column address buffer 102*c* to column predecoder 104, signal CAx is input to one input node of an OR circuit 420 which receives block writing activation signal BWE at another input node, and the output of OR circuit 420 is applied to column predecoder 104. Signal /CAx is input to one input node of an OR circuit 422 which receives block writing activation signal BWE at another input node, and the output of OR circuit 422 is output to column predecoder 104.

More specifically, during the period in which block writing activation signal BWE is in an inactive state ("L" level), OR circuits 420 and 422 output signals corresponding to the levels of received signals CAx and /CAx, respectively to column predecoder 104.

Once a block writing is specified and block writing activation signal BWE is pulled to an active state ("H") level, signals output from OR circuits 420 and 422 attain an "H" level regardless of the levels of internal column address signals CAx and /CAx.

Stated differently, column selecting signals corresponding to memory cell columns separated as signals CAx and /CAx in a normal operation are both activated in a block writing.

More specifically, during a block writing, column selecting signals corresponding to two memory cell columns in a sub-block are activated.

Thus, in sub-block 0 shown in FIG. 2, bit line pairs corresponding to two memory cell columns are simultaneously connected to one local I/O line pair L-I/O.

During a normal operation, connecting a plurality of bit line pairs to the same local I/O line pair L-I/O at a time is prohibited. This is because in a reading, data read out from the bit lines collide on local I/O line pair L-I/O and are destroyed.

However, as described above, in a block writing, by connecting two or more memory cell columns to the same local I/O line pair L-I/O, the same data may be simultaneously written to more memory cells than in a normal writing in a DRAM having a large bus width (or internal bus width).

Figure 4:
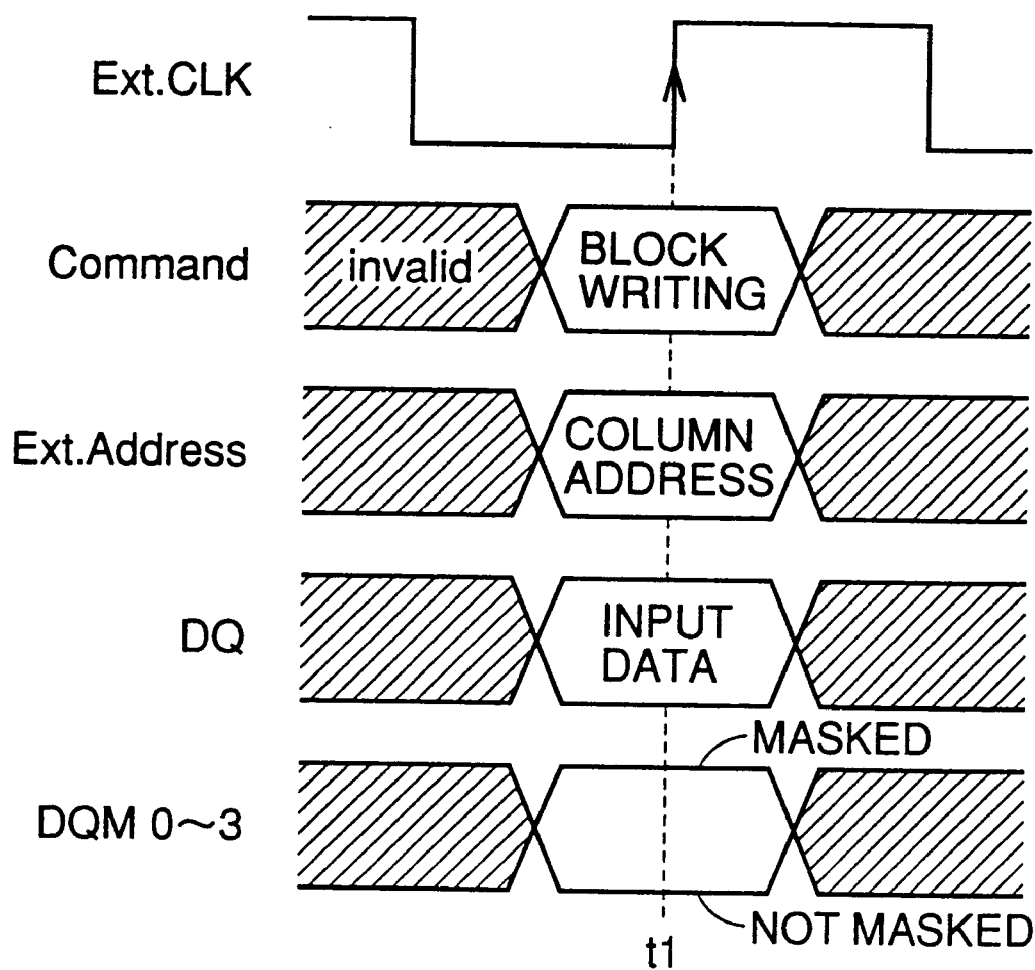
FIG. 4 is a timing chart showing an external control signal to specify a block writing operation mode.

FIG. 4 is a timing chart for use in illustration of the timings of externally applied control signals when such a block writing is externally specified.

More specifically, at time t1 at which external clock signal Ext.CLK rises, a block writing mode is specified by a command signal externally applied to instruction generation circuit 302. At the time, signal Ext.Add to address a column to be written with data and data DQ to be written are simultaneously applied to DRAM 1000.

As will be described, when a data mask operation is specified in a data writing, at time t1, signals DQN0 to DQN3 to specify sub-blocks for data mask operation are applied to DRAM 1000.

As in the foregoing, in the configuration shown in FIG. 3, the same data may be simultaneously written to eight memory cells if there are provided four sub-blocks.

In a DRAM having a higher integration density, however, a redundant memory cell column is generally provided to repair a memory cell column including a defective memory cell generated in the manufacture.

As shown in FIG. 2, besides normal bit line pairs BL1, /BL1 to BLn, /BLn, a bit line pair SBL, /SBL corresponding to the redundant memory cell column is generally provided.

Therefore, as the configuration of column decoder 200, providing column decoder 200*a* as shown in FIG. 3 is not sufficient.

Figure 5:
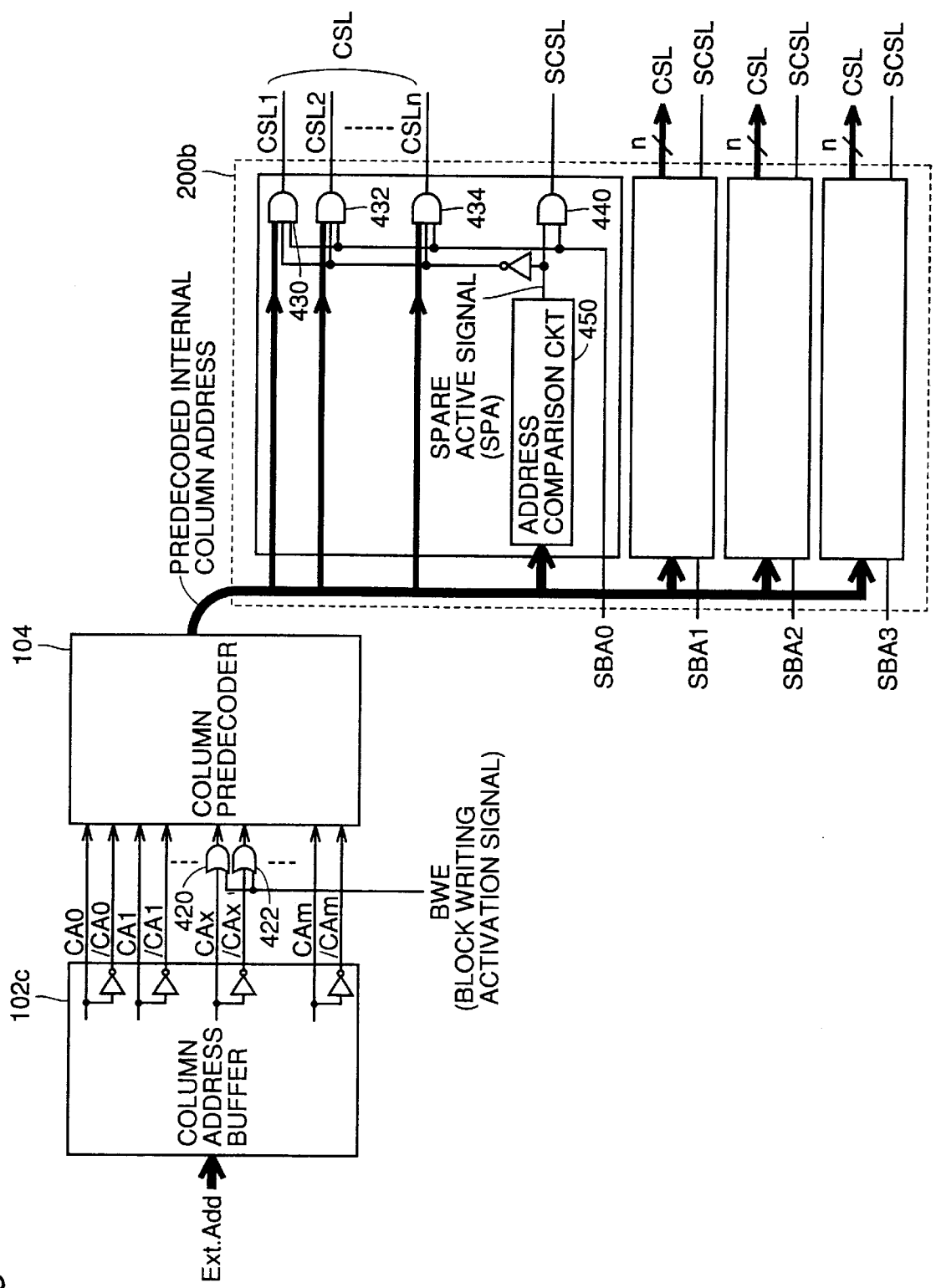
FIG. 5 is a schematic block diagram of the configuration of column decoder circuit 200b.

FIG. 5 is a circuit diagram showing the configuration of a column decoder 200*b* further including a portion to output a redundant memory cell column selecting signal SCSL to enable selection of such a redundant memory cell column.

In column decoder 200*b*, column decoder 200*b*0 provided corresponding to sub-block 0 includes an address comparison circuit 450 which receives a predecoded column address signal output from column predecoder 104, compares the signal with a prestored address for a defective memory cell column including a defective memory cell, and activates spare active signal SPA if the defective address and the predecoded internal column address signal are in coincidence, an inverter which receives signal SPA and outputs the inverse, /NED, and an AND circuit 430 which receives a predecoded internal column address signal, signal /NED and sub-block activation signal SBA0 and outputs a column selecting signal CSL1. AND circuit 430 pulls column selecting signal CSL1 to an inactive level ("L" level) regardless of the values of the predecoded internal column address signal and sub-block activation signal SBA0, once the defective memory cell column is selected and spare active signal SPA is activated.

Decode circuit 200*b*0 further includes AND circuits 432 to 434 having the same configuration as AND circuit 430 corresponding to column selecting signals CSL2 to CSLn, respectively.

Decoder circuit 200*b*0 further includes an AND circuit 440 which receives spare access signal SPA and sub-block activation signal SBA0 and outputs redundant memory cell column selecting signal SCSL.

More specifically, if the predecoded internal column address matches the defective column address, spare active signal SPA is activated, and sub-block activation signal SBA0 is activated, redundant memory cell column selecting signal SCSL attains an active state ("H" level).

Decoder 200*b*0 activates one of column selecting signals CSLi (i=1n) to select a corresponding memory cell column based on the applied predecoded internal column address signal, if the predecoded internal column address signal does not match the defective column address, and inactivates all the column address signals CSL1 to CSLn and activates redundant memory cell column selecting signal SCSL if the predecoded internal column address signal matches the defective column address.

By employing the configuration as shown in FIG. 5, a normal memory cell column may be replaced by a redundant memory cell column without any problem in a normal operation mode.

If a block writing is specified, however, and two memory cell columns are to be simultaneously selected in one sub-block, the following problem is encountered.

As in the foregoing, in a selected sub-block, if an input address and a defective address match, and spare active signal SPA is activated by address comparison circuit 450, in the sub-block, signal SCSL is activated and signals SCL1 to SCLn are all inactivated, because signal /NED is at an "L" level. Then, during a block writing, use of a redundant memory cell column inactivates all the column selecting signals CSL1 to CSLn, a plurality of column selecting signals per sub-block cannot be simultaneously activated.

Figure 6:
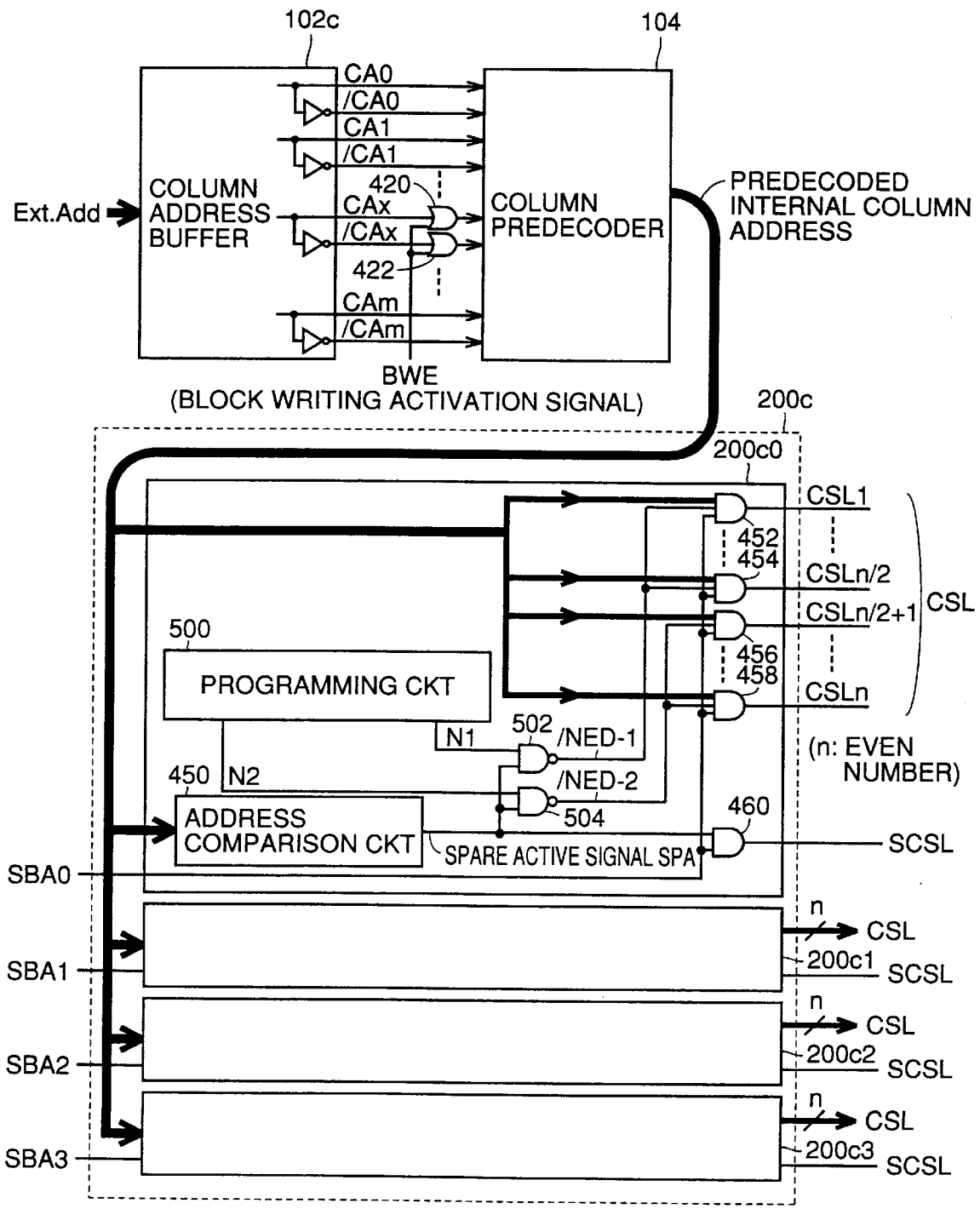
FIG. 6 is a schematic block diagram of the configuration of column decoder circuit 200c according to the first embodiment of the invention.

FIG. 6 is a circuit diagram of the configuration of a column decoder 200*c* directed to a solution to the problem.

The configuration of column decoder circuit 200*c* shown in FIG. 6 is substantially identical to the configuration of column decoder circuit 200*b* shown in FIG. 5 with the following differences.

In column decoder circuit 200*c*, a decoder circuit 200*c*0 provided corresponding to sub-block 0 includes an address comparison circuit 450 which prestores a defective column address in a non-volatile manner and activates spare active signal SPA if a predecoded internal column address signal applied from column predecoder circuit 104 matches the defective column address, a programming circuit 500 for holding output signals N1 and N2 at complementary levels to each other depending upon the state pre-programmed in a non-volatile manner, a NAND circuit 502 which receives signals N1 and SPA and outputs a signal /NED-1, AND circuits 452 to 454 provided corresponding to column selecting signals CSL1 to CSLn/2, respectively and each receiving a predecoded internal column address signal, and a signal /NED-1 and signal SBA0, AND circuits 456 to 458 provided corresponding to column selecting signals CSLn/2+1 to CSLn, respectively and each receiving a predecoded internal column address signal, a signal /NED-2 and sub-block activation signal SBA0, and an AND circuit 460 which receives signals SPA and SBA0 and outputs signal SCSL.

In the configuration shown in FIG. 6, in use of a redundant memory cell column, two separated routes of signals /NED-1 and /NED-2 are employed as a signal to inactivate normal column selecting signals CSL1 to CSLn.

Signals /NED-1 and /NED-2 are input in a block writing to two AND circuit groups corresponding to two column selecting signal groups identified by an invalidated address CAx, in other words the group of column selecting signals CSL1 to CSLn/2 and the group of column selecting signals CSLn/2+1 to CSLn.

More specifically, signal /NED-1 is input to the group of AND circuits 452 to 454 which output column selecting signals CSL1 to CSLn/2, and signal /NED-2 is input to AND circuits 456 to 458 which output signals CSLn/2+1 to CSLn.

When a redundant memory cell column is used, which one of signals /NED-1 and /NED-2 is pulled to an "L" level is pre-programmed at programming circuit 500.

More specifically, programming circuit 500 pulls one of its output signals N1 and N2 to an "H" level and the other to an "L" level.

For example, in a normal operation, signal CAx="L" level corresponds to any of signals CSL1 to CSLn/2 being activated, and signal CAx="H" level corresponds to any of signals CSLn/2+1 to CSLn being activated.

If a defective memory cell column is included in a memory cell column activated by any of signals CSLn/2+1 to CSLn, the CAx of the defective address is at an "H" level. At the time, programming circuit 500 is set to output signal N1 at an "L" level and signal N2 at an "H" level.

If the input address and the defective address are in coincidence, address comparison circuit 450 activates spare active signal SPA, and signal SCSL is activated, signal /NED-1 attains an "H" level, signal /NED-2 attains an "L" level and the group of column selecting signals CSLn/2+1 to CSLn on the side including the defective memory cell column have their levels all brought into an inactivate state.

As a result, in a block writing, redundant memory cell column selecting signal SCSL is activated, and one of column selecting signals CSL1 to CSLn/2 is activated.

More specifically, if a replacing operation by a redundant memory cell column is performed, two memory cell columns may be selected at a time in a block writing.

If a defective memory cell column is included in memory cell columns corresponding to column selecting signals CSL1 to CSLn/2, the signal CAx of the defective address is at an "L" level. At the time, programming circuit 500 is set in a non-volatile manner to output signal N1 at an H level, and signal N2 at an "L" level. Thus, if an input address and a defective address are in coincidence and redundant memory cell column selecting signal SCSL is activated, signal /NED-1 is pulled to an "L" level, signal NED-2 is pulled to an "H" level, and the side of column selecting signals CSL1 to CSLn/2 corresponding to the group of memory cell columns including the defective memory cell column is inactivated.

Also in this case, in a block writing, redundant memory cell column selecting signal SCSL as well as one of column selecting signals CSLn/2+1 to CSLn is activated at a time.

Thus, if a memory cell column including a defective memory cell is replaced with a redundant memory cell column, a plurality of memory cell columns may be simultaneously selected for each of sub-blocks, and therefore a block writing may be enabled in a DRAM having a large bus width (internal bus width).

Furthermore, in the configuration shown in FIG. 6, it is not necessary to increase the number of sub-blocks, the area occupied by the memory cell array does not increase.

Figure 7:
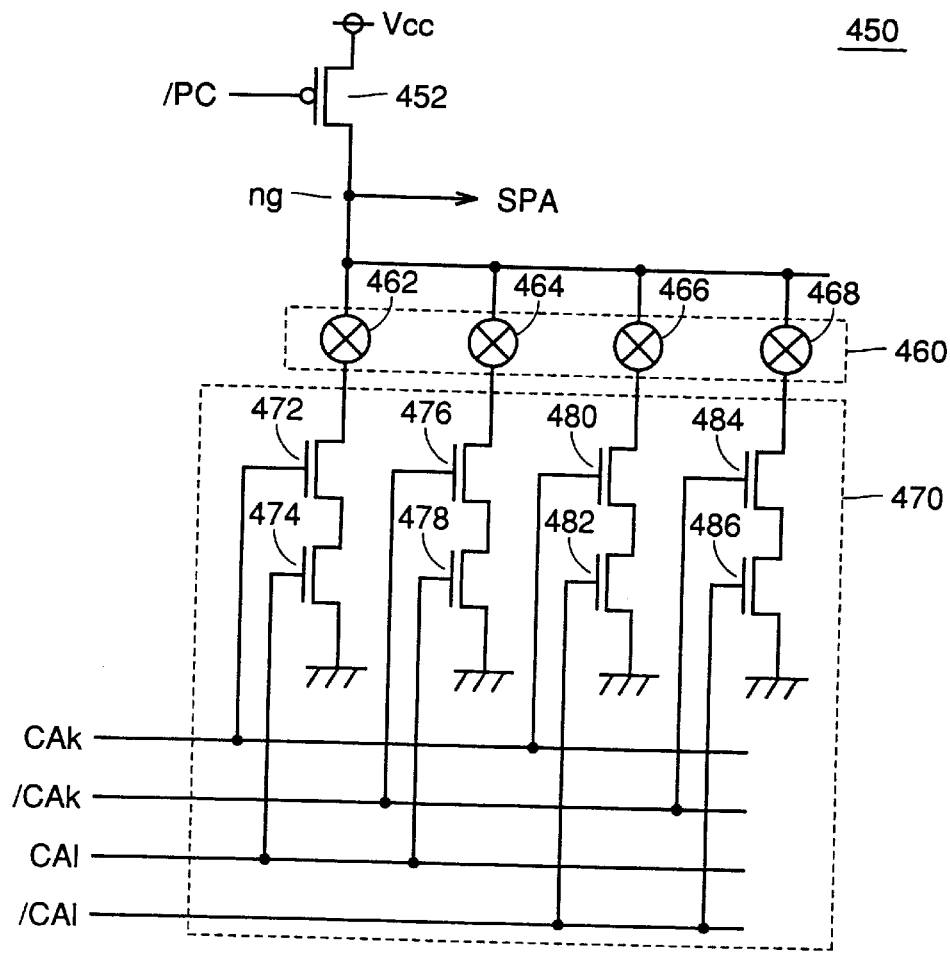
FIG. 7 is a circuit diagram of the configuration of address comparison circuit 450.

FIG. 7 is a circuit diagram showing the configuration of address comparison circuit 450 shown in FIG. 6.

Hereinafter, for ease of representation, columns in sub-blocks are referred to by predecoded internal column address signals (hereinafter referred to as "predecode signals") Cak, /Cak and Cal, /Cal.

Column address comparison circuit 450 includes an N channel transistor 474 receiving predecode signal Cak at its gate and having its source connected to a ground node, an N channel transistor 472 receiving predecode signal Cal at its gate and connected in series to N channel transistor 474, an N channel transistor 478 receiving predecode signal Cal at its gate and having its source connected to the ground node, an N channel transistor 476 receiving predecode signal /Cak at its gate and connected in series to N channel transistor 478, an N channel transistor 482 receiving predecode signal /Cal at its gate and having its source connected to the ground node, an N channel transistor 480 receiving predecode signal Cak at its gate and connected in series to N channel transistor 482, an N channel transistor 486 receiving predecode signal /Cal at its gate and having its source connected to the ground node, and an N channel transistor 484 receiving predecode signal /Cak at its gate and connected in series to N channel transistor 486.

A fuse group 460 includes a fuse 462 provided between the drain of N channel transistor 472 and a charging node nq, a fuse 464 provided between the drain of N channel transistor 476 and charging node nq, a fuse 466 provided between the drain of N channel transistor 480 and charging node nq, and a fuse 468 provided between the drain of N channel transistor 484 and charging node nq.

If one of fuses 462 to 468 is blown, after charging node nq performed in response to precharge signal /PC, signal SPA at an "H" level is output from the charging node, only if predecode signals Cak, /Cak and Cal, /Cal attain a level corresponding to the defective address.

Figure 8:
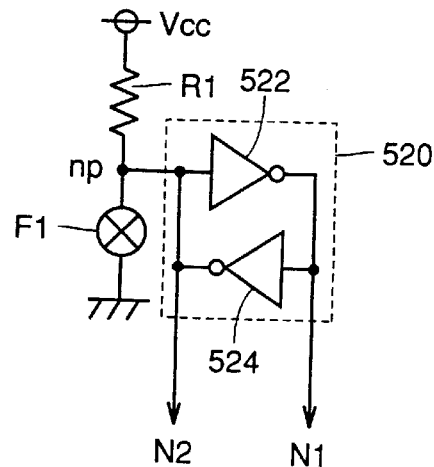
FIG. 8 is a circuit diagram of the configuration of programming circuit 500.

FIG. 8 is a circuit diagram showing in more detail the configuration of programming circuit 500 shown in FIG. 6.

Programming circuit 500 includes a resistor R1 and a fuse element F1 connected in series between a power supply potential Vcc and a ground potential GND, and a latch circuit 520 which receives as an input the potential level of the connection node np of resistor R1 and fuse element F1.

Latch circuit 520 includes an inverter 522 which receives as an input the potential level of node np, and an inverter 524 which receives as an input the output of inverter 522 and has its output node connected to node np.

The output of inverter 522 is output as signal N1, and the output of inverter 524 is output as signal N2.

More specifically, the levels of signals N1 and N2 are potential levels complementary to each other which are determined depending upon the potential level of node np.

Figure 9:
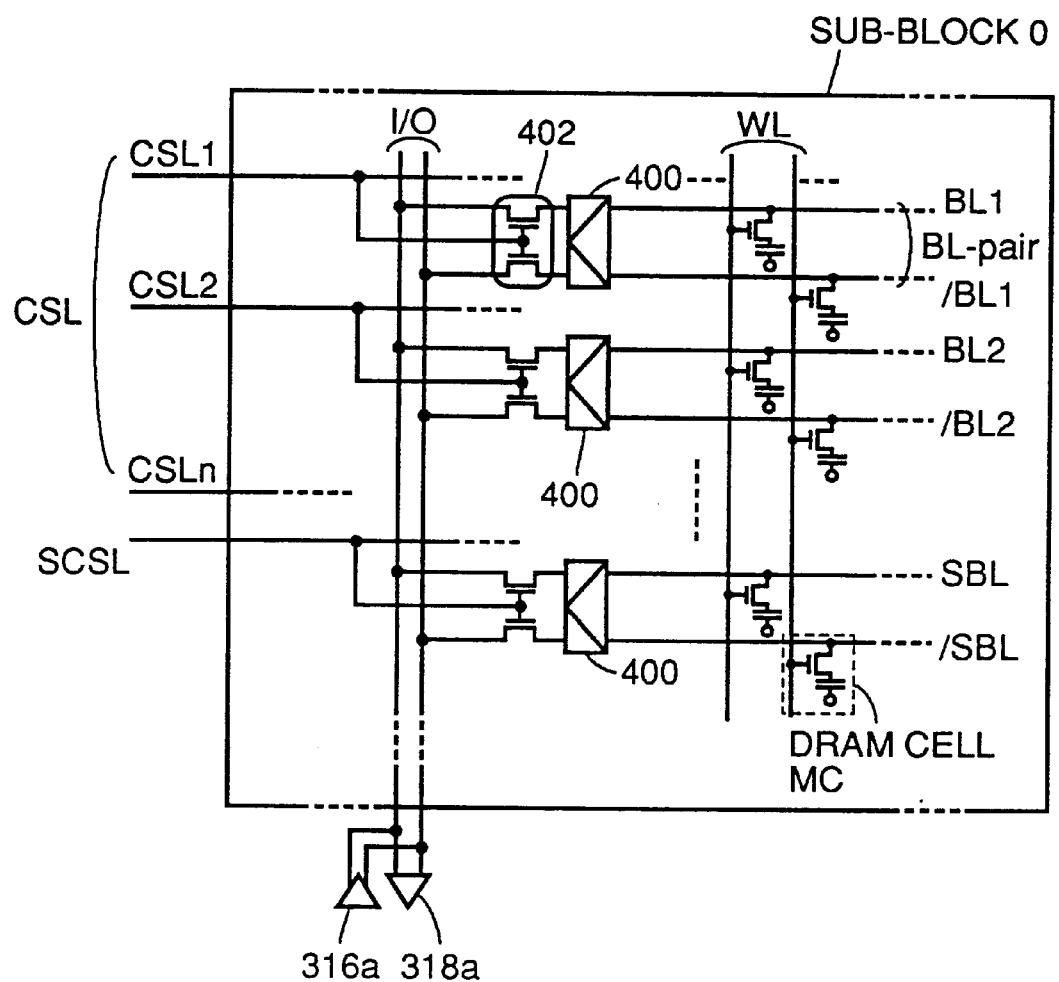
FIG. 9 is a circuit diagram of another example of memory cell array mat 300.

FIG. 9 is a circuit diagram showing another example of sub-block 0 shown in FIG. 2.

Sub-block 0 shown in FIG. 9 is different from sub-block 6 shown in FIG. 2 in that in sub-block 0 shown in FIG. 2, data input/output line pairs have a hierarchical structure formed of global I/O line pair G-I/O and local I/O line pair L-I/0, while in sub-block 0 in FIG. 9, writing driver circuit 316a and reading amplifier 318a are directly connected to the I/O line pair I/O rather than in the hierarchical structure.

Since the other portions are the same as those of the memory cell array mat shown in FIG. 2, and therefore the same portions are denoted by the same reference characters and the description will not be repeated.

Depending upon the arrangement of sub-blocks in the memory cell array mat as shown in FIG. 9, if a memory cell column including a defective memory cell in a sub-block is replaced by a redundant memory cell column, the same data may be simultaneously written to more memory cells than a normal writing in a block writing as is the case with the arrangement of sub-blocks shown in FIG. 2.

Second Embodiment

Figure 10:
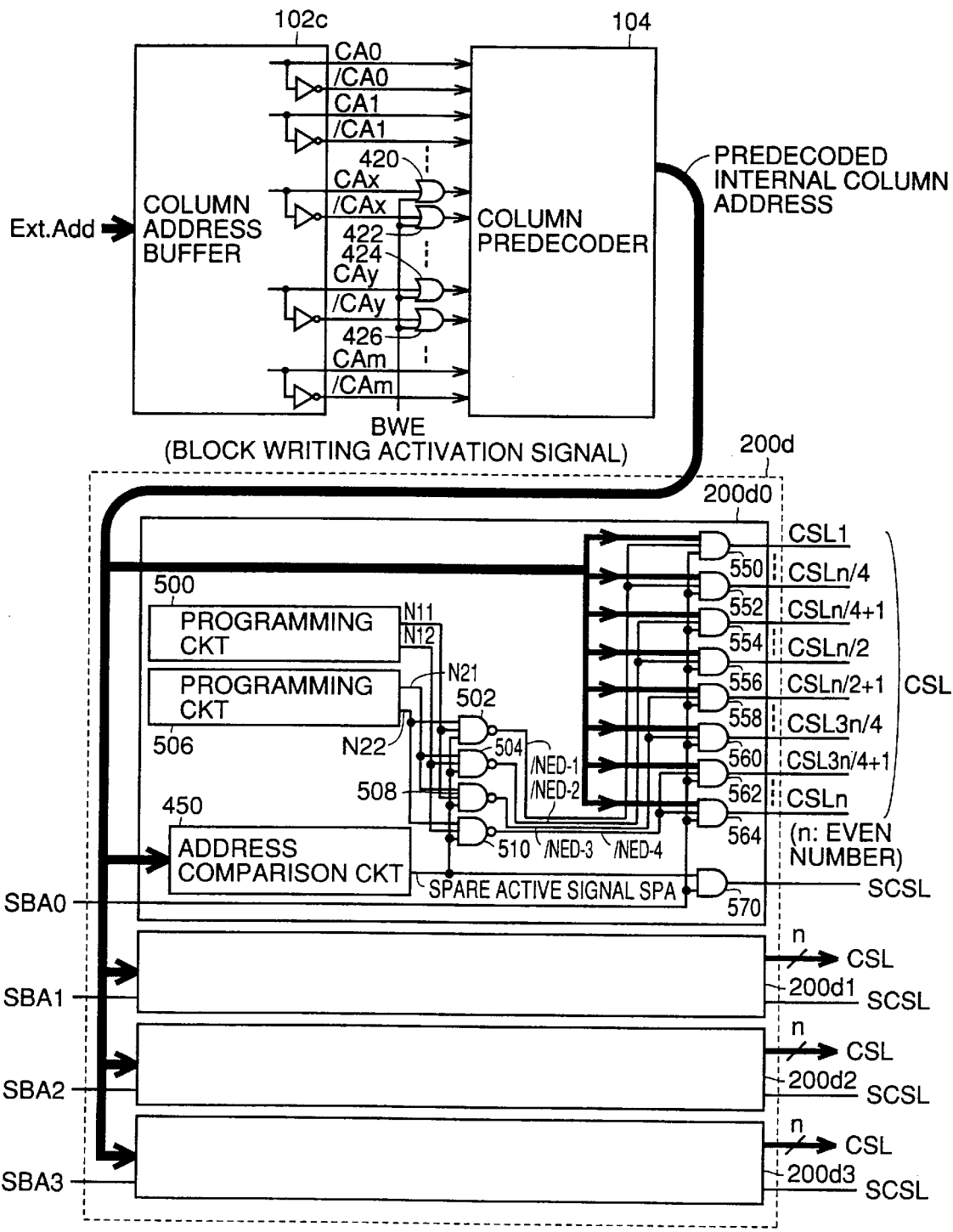
FIG. 10 is a schematic block diagram of the configuration of a column decoder circuit 200d according to a second embodiment of the invention.

FIG. 10 is a block diagram of the configuration of a column selecting circuit in a DRAM according to a second embodiment of the invention and corresponds to FIG. 6 according to the first embodiment.

In a circuit configuration shown in FIG. 10, four memory cell columns per sub-block are simultaneously activated during a block writing.

In order to activate a column selecting signal CSLi corresponding to four memory cell columns per sub-block, two bits of addresses (CAx, CAy) are invalidated in a block writing.

More specifically, in addition to OR circuit 420 which receives signal CAx among internal address signals CA0, /CA0 to CAm, /CAm output from column address buffer 102c at its one input node and OR circuit 422 which receives signal /CAx at its one input node, an OR circuit 424 which receives signal CAy at its one input node and block writing activation signal BWE at its the other input node, and an OR circuit 426 which receives block writing activation signal BWE at its the other input node are provided.

Output signals from OR circuits 420 to 426 are applied to column predecoder 104.

In column decoder 200d shown in FIG. 10, signals which inactivate column selecting signal CALi corresponding to a normal memory cell column are classified into four kinds of signals /NED-1 to /NED-4. More specifically, decoder 200d0 provided corresponding to sub-block 0 in a column decoder 200d includes a first programming circuit 500 which outputs complementary signals N11 and N12, a second programming circuit 506 which outputs complementary signals N21 and N22, a NAND circuit 502 which receives signal N22 at its first input node, N11 at its second input node, and spare active signal SPA at its third input node, a NAND circuit 504 which receives signal N21 at its first input node, signal N12 at its second input node, and spare active signal SPA at its third input node, a NAND circuit 508 which receives signal N21 at its first input node, N11 at its second input node, and spare active signal SPA at its third input node, and a NAND circuit 510 which receives signal N22 at its first input node, signal N12 at its second input node, and spare active signal SPA at its third input node.

Decoder 200*d*0 further includes AND circuits 550 to 552 provided corresponding to column selecting signals CSL1 to CSLn/4, each receiving a predecoded internal column address signal, signal /NED1 and signal SPA and outputting signals CSL1 to CSLn/4, respectively, AND circuits 554 to 556 provided corresponding to column selecting signals CSLn/4+1 to CSLn/2, each receiving a predecoded internal column address signal, signal /NED-2, and signal SPA, and outputting signals CSLn/4+1 to CSLn/2, respectively, AND circuits 558 to 560 provided corresponding to signals CSLn/2+1 to CSL3n/4, each receiving a predecoded internal column address signal, signal /NED-3, and signal SPA and outputting signals CSLn/2+1 to CSL3n/4, respectively, AND circuits 562 to 564 provided corresponding to signals CSL3n/4+1 to CSLn, each receiving a predecoded internal column address signal, signal /NED-4, and signal SPA and outputting signals CSL3n/4+1 to CSLn, respectively, and an AND circuit 570 which receives signal SPA, and sub-block activation signal SBA0 and outputs redundant memory cell column activation signal SCSL.

More specifically, column selecting signals CSLi corresponding to normal memory cell columns are classified into four separated routes of signals, signals /NED-1 to signal /NED-4 in the group separated by internal address signals CAx and CAy among the four CSLi groups are input to AND circuits provided corresponding to the column groups.

Two programming circuits are provided for each sub-block, and in each of programming circuits 500 and 502, a column group including a defective memory cell column among the four column groups is inactivated if a redundant memory cell column is used by blowing or not blowing a fuse depending upon the values of CAx and CAy of the defective address.

Decode circuits 200*d*1 to 200*d*3 provided corresponding to the other sub-blocks have the same configuration as decode circuit 200*d*0.

As a result, when a redundant memory cell column is used, three column selecting signals CSLi corresponding to normal memory cell columns are activated other than redundant memory cell column selecting signal SCSL in a block writing. As a result, four memory cell columns may be simultaneously activated per sub-block.

Third Embodiment

Figure 11:
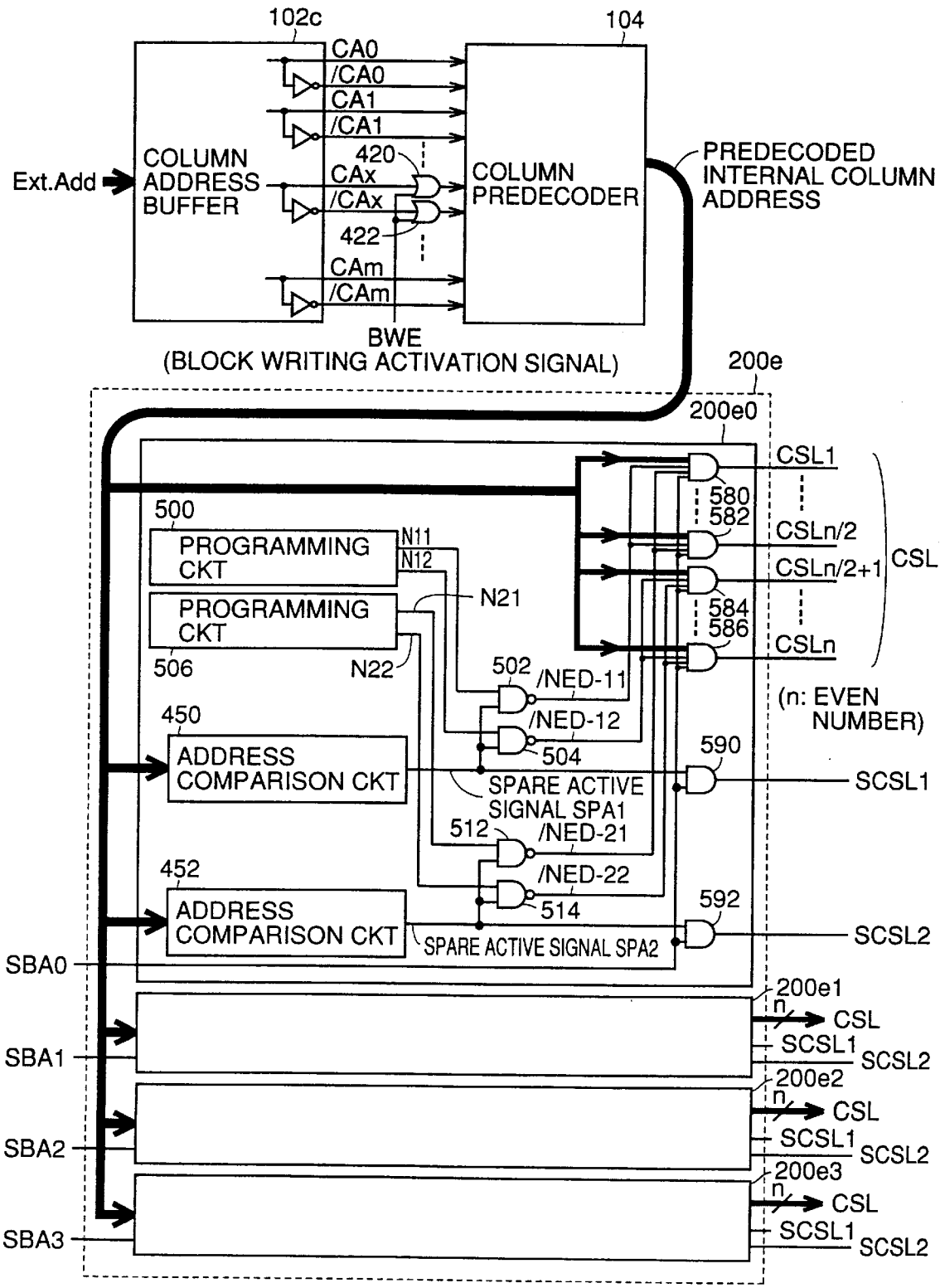
FIG. 11 is a schematic block diagram of the configuration of a column decoder circuit 200e according to a third embodiment of the invention.

FIG. 11 is a schematic block diagram of a circuit to select a memory cell column according to a third embodiment of the invention, particularly the configuration of column decoder 200*e*.

In column decoder circuit 200*e*, a decoder 200*e*0 provided corresponding to sub-block 0 is provided with two kinds of circuits for generating a redundant memory cell column selecting signal to select a redundant memory cell column.

Normal memory cell columns in sub-block 0 are divided into a first column group selected by column selecting signals CSL1 to CSLn/2, and a second column group selected by column selecting signals CSLn/2+1 to CSLn.

Whether the first column group is selected or the second column group is selected is determined in a normal reading/writing depending upon the value of internal address signal CAx.

During the period of a block writing, a memory cell column is selected regardless of the value of internal column address signal CAx.

Stated differently, one column from the first column group and one column from the second column group are selected.

Column decoder circuit 200*e* according to the third embodiment is different from column decoder 200*c* according to the first embodiment as shown in FIG. 6 in the following points.

Decode circuit 200*e*0 includes a first address comparison circuit 450 which stores a defective address in a non-volatile manner, and activates first spare active signal SPA1 if the predecoded internal column address signal matches the stored defective address, a second address comparison circuit 452 which stores a defective address in a non-volatile manner, and activates a second spare active signal SPA2 if a predecoded internal column address matches the stored defective address, a first programming circuit 500 which outputs complementary signals N11 and N12 based on information stored in a non-volatile manner, a second programming circuit 506 which outputs complementary signals N21 and N22 based on information stored in a non-volatile manner, a NAND circuit 502 which receives signals N11 and SPA1 and outputs a signal /NED-11, a NAND circuit 504 which receives signals N12 and SPA1 and outputs a signal /NED-12, a NAND circuit 512 which receives signals N21 and SPA2 and outputs signal /NED-21, and a NAND circuit 514 which receives signals N22 and SPA2 and outputs signal /NED-22.

Decoder circuit 200*e*0 further includes AND circuits 580 to 582 provided corresponding to the first column group, each receiving a predecoded internal column address signal, signal NED-11, signal /NED-21, and sub-block activation signal SBA0, and output signals CSL1 to CSLn/2, respectively, AND circuits 584 to 586 provided corresponding to the second column group, each receiving a predecoded internal column address signal, signal /NED-12, and signal /NED-22, and output signals CSLn/2+1 to signal CSLn, respectively, an AND circuit 590 which receives signals SPA1 and SPA0 and outputs a first redundant column selecting signal SCSL1, and an AND circuit 592 which receives signals SPA2 and SBA0 and outputs a second redundant column selecting signal SCSL2.

In the configuration shown in FIG. 11, since programming circuits are provided independently for signals SCSL1 and SCSL2, the signals are independently programmed depending upon defective addresses which the signals are to repair.

As a result, if two redundant memory cell columns are present in a sub-block, and a normal memory cell is replaced with a redundant memory cell column, in a block writing the same data may be simultaneously written to more memory cells than a normal writing.

Decoder circuits 200*e*1 to 200*e*3 provided corresponding to sub-blocks 1 to 3 have the same configuration.

Note that in the third embodiment, two redundant memory cell columns are provided for each of sub-blocks, but the invention is not limited to this, and is generally applicable to any case in which the number of redundant memory cell columns per sub-block is $2^n$ (n: natural number).

Fourth Embodiment

Figure 12:
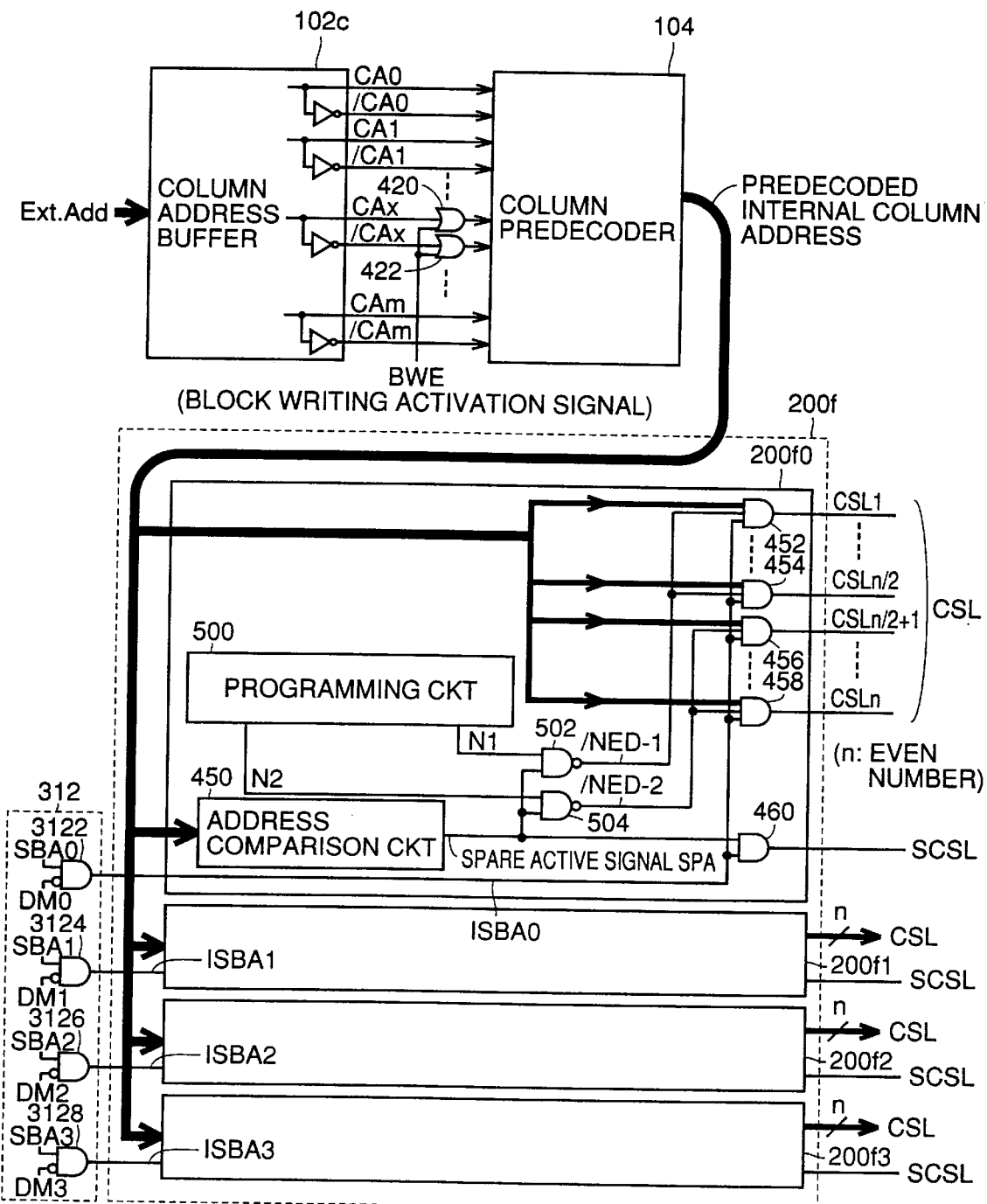
FIG. 12 is a schematic block diagram of the configuration of a column selection related circuit according to a fourth embodiment of the invention.

FIG. 12 is a schematic block diagram of a circuit portion of a DRAM according to a fourth embodiment of the invention for a column selecting operation.

The configuration of a column selection related circuit shown in FIG. 12 is different from the column selection-related circuit according to the first embodiment shown in FIG. 1 in the following points.

In the column selection-related circuit shown in FIG. 6, sub-block activation signal SBA0 is directly input to decoder 200*c*0 provided corresponding to sub-block 0 in column decoder 200*c*.

Meanwhile, input to a decoder circuit 200/0 shown in FIG. 12 are a signal DM0 output from a data mask signal control circuit 310 and the output of a logical gate circuit 3122 which receives sub-block activation signal SBA0.

Logic gate circuit 3122 is included in sub-block signal control circuit 312 shown in FIG. 1.

Logic gate circuit 3122 outputs signal ISBA0 corresponding to the level of received sub-block activation signal SBA0 when data mask signal DM0 is in an inactive state, and outputs signal ISBA0 at an "L" level regardless of the level of signal SBA0 if signal DM0 is in an active state ("H" level).

For the other sub-blocks 1 to 3, the output signal ISBA1 of logic gate circuit 3124 which receives signals DM1 and SBA1 is output to decoder circuit 200/1 corresponding to sub-block 1, the output signal ISBA2 of logic gate 3126 which receives signals SBA2 and DM2 is output to decoder 200/2 provided corresponding to sub-block 2, and the output signal ISBA3 of logic gate 3126 which receives signals SBA3 and DM3 is output to decoder 200/3 provided corresponding to sub-block 3.

In decoder circuit 200c according to the first embodiment shown in FIG. 6, signals SBA0 to SBA3 are replaced by signals ISBA0 to ISBA3, and column decoder circuit 200f according to the fourth embodiment has the same configuration as column decoder circuit 200c according to the first embodiment, and therefore the same portions are denoted by the same reference characters, and the description will not be repeated.

By employing the configuration as shown in FIG. 12, among externally applied data mask signals, if signal DM0 is in an active state, for example, signal ISBA0 attains an "L" level, and therefore a column selecting signal output from decoder circuit 200/0 is fixed in an inactive state ("L" level).

Thus, the activation of data mask signal DM0 disables a column selecting operation in a corresponding sub-block, and a data writing to a memory cell column is prohibited.

Figure 13:
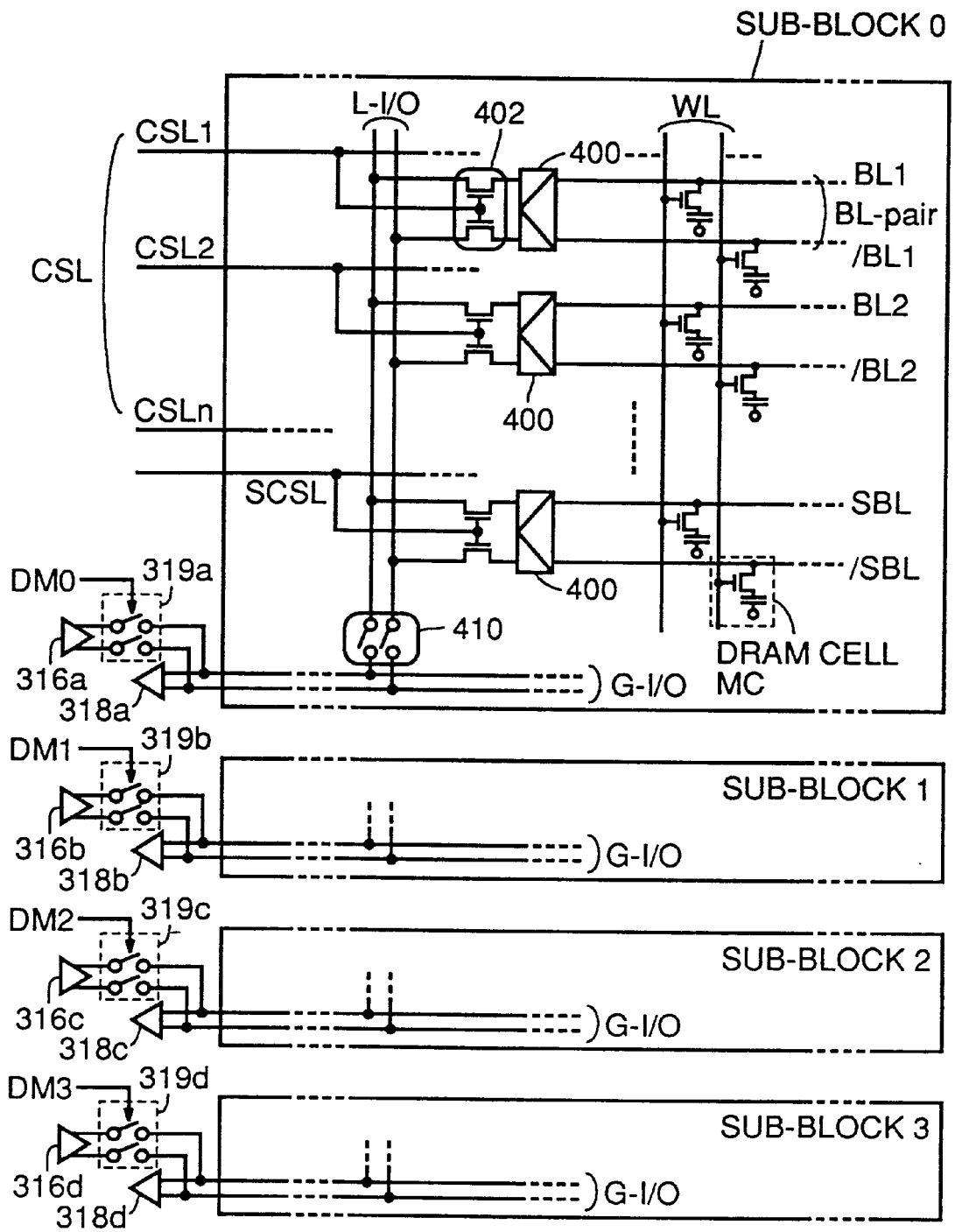
FIG. 13 is a schematic block diagram of the configuration of memory cell array mat 300, writing driver circuit 316 and reading amplifier 318 according to the fourth embodiment of the invention.

FIG. 13 is a circuit diagram of the configuration of a memory cell array mat according to the fourth embodiment of the invention, and corresponds to FIG. 2 according to the first embodiment.

The configuration of the memory cell array mat according to the fourth embodiment is substantially identical to the configuration of the memory cell array mat according to the first embodiment with essential difference being that there are provided switch circuits 319a to 319d provided corresponding to writing driver circuits 316a to 316d, for connecting corresponding writing driver circuits 316a to 316d to a corresponding global I/O line pair G-I/O during the period in which corresponding data mask signals DM0 to DM3 are in an active state ("H" level), and isolating the circuits from corresponding global I/O line pair G-I/O when signals DM0 to DM3 are at an "L" level.

The other elements are the same as those of the memory cell array mat shown in FIG. 2, and therefore the same portions are denoted by the same reference characters and the description will not be repeated.

By employing the configuration as shown in FIGS. 12 and 13, a writing masking function of avoiding writing data to only a desired bit in a writing operation may be achieved, in other words data is not written to a memory cell column belonging to a sub-block specified by signals DM0 to DM3.

In addition, in the circuit configuration shown in FIGS. 12 and 13, when a plurality of memory cell columns are simultaneously selected for one sub-block in order to perform a block writing, in other words when bit line pairs corresponding to a plurality of memory cell columns are simultaneously connected to one local I/O line pair, data is not destroyed in a writing-masked sub-block.

More specifically, in order to implement a writing masking function, for example, if a writing driver circuit corresponding to a selected sub-block among writing driver circuits 316a to 316d is simply isolated from a corresponding global I/O line pair G-I/O based on signals DM0 to DM3, a plurality of bit line pairs will be connected to the same local I/O line pair L-I/O in a block writing.

In this case, data read out from bit lines collide on the local I/O line pair L-I/O, and data is destroyed. If a writing masking is not provided, new data will be driven by writing drivers 318a to 318d, while if a writing masking is provided, the data as destroyed is written into the original memory cell, the data in the memory cell will be destroyed.

In the DRAM according to the fourth embodiment shown in FIGS. 12 and 13, the writing masking function and the block writing functions are both simultaneously enabled.

As a result, a block writing may be allowed only for a desired sub-block, and therefore the operation of clearing image data in a desired region among the entire image data at a high speed may be implemented.

Furthermore, as shown in FIG. 1, signals DM0 to DM3 output from data mask signal control circuit 310 are all at an "L" level during the period in which a reading is specified.

Stated differently, during a reading, in other words reading mode specifying signal RS is in an active state ("H" level), selected sub-block activation signals SBA0 to SBA3 are automatically directly transmitted to corresponding decoder circuits 200/0 to 200/3, respectively based on an externally applied address signal.

Thus, during a reading, if externally applied signals DQM0 to DQM3 erroneously attain an "H" level, signals DM0 to DM3 are fixed at an "L" level during the reading, and therefore a normal reading may be performed regardless of the level of these externally applied signals DQM.

Figure 14:
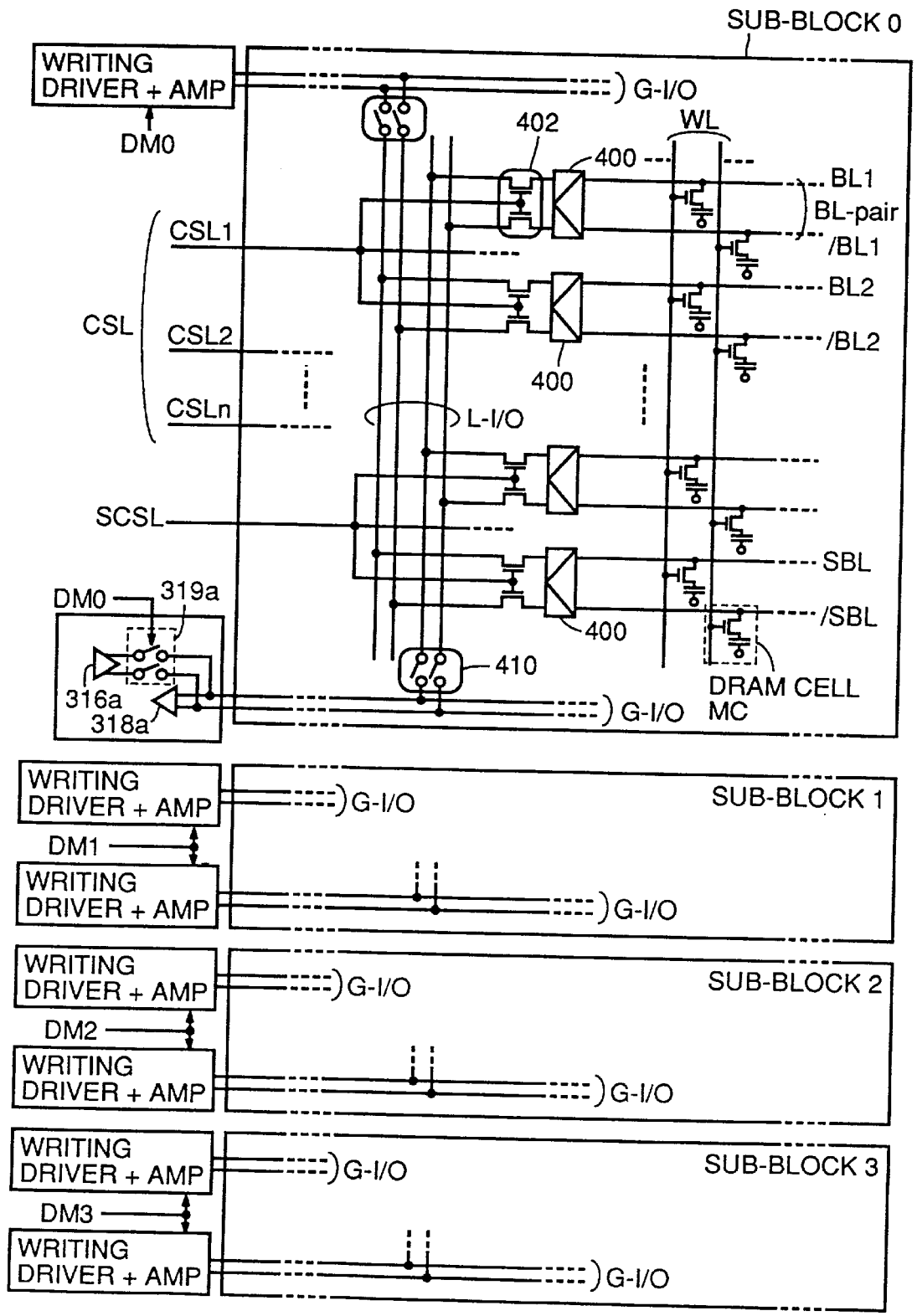
FIG. 14 is a schematic block diagram of another example of memory cell array mat 300, writing driver circuit 316 and reading amplifier 318 according to the fourth embodiment of the invention.

FIG. 14 is a circuit diagram of another example of the memory cell array mat shown in FIG. 13.

The memory cell array mat shown in FIG. 13 is different in that in response to one column selecting signal CSL1 two memory cell columns are selected at a time, and writing data is transmitted to the two memory cell columns by independently provided global I/O line pair G-I/O and independently provided local IO line pair L-I/O.

The other elements are the same as those of the circuit configuration shown in FIG. 13, the same portions are denoted by the same reference characters, and the description will not be repeated.

By employing the configuration shown in FIG. 14, if two memory cell columns are simultaneously selected for one column selecting line, the block writing function and the writing masking function are compatible at a time, and the same data may be written to more memory cells than a normal writing permits to a DRAM having a large bus width (internal bus width).

Fifth Embodiment

Figure 15:
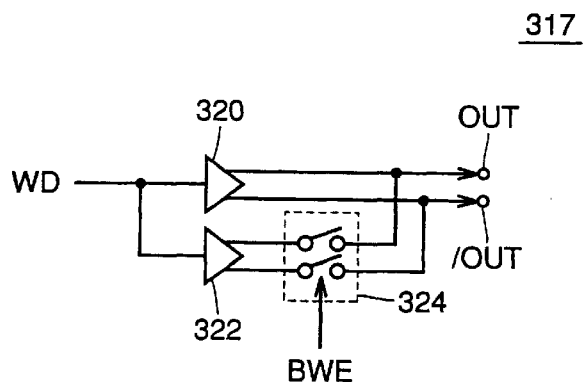
FIG. 15 is a schematic block diagram of the configuration of a writing driver circuit 317 according to a fifth embodiment of the invention.

FIG. 15 is a schematic block diagram of a writing driver circuit 317 according to a fifth embodiment of the invention.

Only the configuration and operation of writing driver circuit 317 will be described, because the other elements are the same as those of the DRAMs according to the first to fourth embodiments.

Writing driver circuit 317 includes a first writing driving circuit 320 for outputting complementary internal writing data to output nodes OUT and /OUT based on externally applied writing data, a second writing driving circuit 322 which receives externally applied writing data WD and outputs complementary writing data, and a switch circuit 324 which receives the output of second writing driving circuit 322, connects second writing driving circuit 322 to output nodes OUT, /OUT when block circuit activation signal BWE is activated, and isolates second writing driving circuit 322 from output nodes OUT, and /OUT when signal BWE is in an inactive state.

According to the first to third embodiments as described, output nodes OUT and /OUT may be directly connected to corresponding global I/O line pair G-I/O, or may be selectively connected to corresponding global I/O line pair G-I/O by the function of switch circuits 319a to 319d.

Thus, during a block writing, if a plurality of column selecting signals per sub-block are activated, and if a plurality of bit line pairs are connected to the same local I/O line pair L-I/O, the load driving capability of the writing driver circuit may be increased than in a normal operation mode.

As a result, data may be written at a high speed during the block writing.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device having a block writing mode, comprising:
   at least one memory cell array mat each including a plurality of memory cells arranged in a matrix of rows and columns,
   said memory cell array mat including:
      a plurality of sub-blocks each including a plurality of memory cell columns, and
      a redundant memory cell column to be replaced with a memory cell column including a defective memory cell among the memory cells in said sub-block,
      each said sub-block being divided into a plurality of column groups;
   column selecting means responsive to an address signal for selecting at least one corresponding memory cell column in said memory cell array mat,
   said column selecting means including:
      column selecting signal generation means for generating column selecting signals to select one corresponding memory cell column for each of said column groups, in said block writing mode specified in response to an operation mode specifying signal, and
      column replacing means for selecting a corresponding redundant memory cell column and inactivating a column selecting signal to a column group having a defective memory cell, if said column selecting signal matches the defective address corresponding to the defective memory coil; and
   writing means for selecting a memory cell row corresponding to said address signal and writing storage data simultaneously to a plurality of memory cells corresponding to said selected memory cell row and said selected memory cell columns during a period in which said block writing mode is specified.

2. The semiconductor memory device as recited in claim 1, wherein
   said column replacing means includes,
      comparison means for storing said defective address in a non-volatile manner, and activates a redundant column selecting signal to select said redundant memory cell column if said column selecting signal matches said defective address, and
      programming means for storing a column address corresponding to said defective address in a non-volatile manner, and activating a selection disabling signal for prohibiting a selecting operation to said corresponding column group in response to an activation of said redundant column selecting signal.

3. The semiconductor memory device as recited in claim 2, wherein
   said programming means includes defective address storing means,
   said defective address storing means includes,
      a first power supply node receiving a first potential corresponding to an active level,
      a second power supply node receiving a second potential corresponding to an inactive level, and
      a resistor and a fuse element connected in series to said first and second power supply nodes, said semiconductor memory device further comprising,
         a logic gate for activating said selection disabling signal in response to an active level of the potential of the connection node of said fuse element and said resistor and an active level of said redundant selecting signal.

4. The semiconductor memory device as recited in claim 1, wherein
   said writing means includes,
      first driving means having a first current driving capability;
      second data driving means having a second current driving capability; and
      switching means responsive to a specification of said block writing operation for driving said first and second data driving means in parallel to perform a data writing.

5. The semiconductor memory device as recited in claim 1, wherein
   m said redundant memory cell columns (m: natural number, m≧2) are provided for each of said sub-block,
   said replacing means is provided corresponding to each of said redundant memory cell columns,
   each said replacing means includes,
      comparison means for storing said defective address in a non-volatile manner, and activating the redundant column selecting signal to select a corresponding one of said redundant memory cell columns if said column selecting signal matches said defective address; and
      programming means for storing in a non-volatile manner a column address corresponding to said defective address and activating selection disabling means for prohibiting a selecting operation to said corresponding column group in response to an activation of said redundant column selecting signal.

6. The semiconductor memory device as recited in claim 5, wherein
   said writing means includes,
      first data driving means having a first current driving capability;

second data driving means having a second current driving capability; and switching means responsive to a specification of said block writing operation for driving said first and second data driving means in parallel to perform a data writing.

7. The semiconductor memory device as recited in claim 1, wherein said column selecting means further includes column selection masking control means responsive to an externally applied control signal for disabling a column selecting operation to a sub-block to which a write masking operation is specified.

8. The semiconductor memory device as recited in claim 7, wherein said writing means further includes writing masking control means for disabling a data writing operation to said sub-block to which a writing masking operation is specified.

9. The semiconductor memory device as recited in claim 7, further comprising means responsive to an externally applied control signal and a specification of a reading mode for inactivating said column selecting masking control means.

10. The semiconductor memory device as recited in claim 7, wherein said writing means includes,
first data driving means having a first current driving capability;
second data driving means having a second current driving capability; and switching means responsive to a specification of said block writing operation for driving said first and second driving means in parallel to perform a data writing.

11. The semiconductor memory device as recited in claim 1, wherein said writing means includes:
driving means for driving an output potential level in response to said storage data,
a data line for transmitting said storage data to said selected memory cell columns in response to said output potential level, and
a plurality of column switching gates respectively provided for said memory cell columns, and each controlled by said column selecting means for coupling said data line to said selected memory cell columns; and
wherein during said block writing mode, said column selecting means selects as many memory cell columns as said column groups in each of said sub-blocks.

12. The semiconductor memory device as recited in claim 11, wherein said column selecting means selects more memory cell columns during said block writing mode than during normal mode.

* * * * *